United States Patent
Kobayashi et al.

(10) Patent No.: US 10,553,777 B2
(45) Date of Patent: Feb. 4, 2020

(54) MULTI-LAYERED FILM, METHOD OF MANUFACTURING THE SAME, AND MANUFACTURING APPARATUS OF THE SAME

(71) Applicant: ULVAC, INC., Chigasaki-shi (JP)

(72) Inventors: Hiroki Kobayashi, Chigasaki (JP);
Mitsunori Henmi, Chigasaki (JP);
Mitsutaka Hirose, Chigasaki (JP);
Shinnosuke Mashima, Chigasaki (JP);
Isao Kimura, Chigasaki (JP); Koukou Suu, Chigasaki (JP)

(73) Assignee: ULVAC, INC., Chigasaki-Shi (JP)

( * ) Notice: Subject to any disclaimer, the term of this patent is extended or adjusted under 35 U.S.C. 154(b) by 360 days.

(21) Appl. No.: 15/319,597

(22) PCT Filed: Jun. 11, 2015

(86) PCT No.: PCT/JP2015/066891
§ 371 (c)(1),
(2) Date: Dec. 16, 2016

(87) PCT Pub. No.: WO2015/194453
PCT Pub. Date: Dec. 23, 2015

(65) Prior Publication Data
US 2017/0141289 A1 May 18, 2017

(30) Foreign Application Priority Data
Jun. 20, 2014 (JP) .................................. 2014-127469

(51) Int. Cl.
*C23C 14/34* (2006.01)
*H01L 41/083* (2006.01)
(Continued)

(52) U.S. Cl.
CPC ............ *H01L 41/083* (2013.01); *C23C 14/34* (2013.01); *C23C 14/588* (2013.01);
(Continued)

(58) Field of Classification Search
CPC .................................................... C23C 14/588
See application file for complete search history.

(56) References Cited

U.S. PATENT DOCUMENTS

2009/0114912 A1* 5/2009 Large ...................... H01L 22/22
257/48
2009/0294280 A1 12/2009 Kimura et al.

FOREIGN PATENT DOCUMENTS

JP 08-148369 6/1996
JP 2001-135800 5/2001
(Continued)

OTHER PUBLICATIONS

European Search Report from corresponding EPO Application No. 15810304.4 dated Dec. 14, 2017.
(Continued)

*Primary Examiner* — Jason Berman
(74) *Attorney, Agent, or Firm* — Grossman, Tucker, Perreault & Pfleger, PLLC

(57) ABSTRACT

A multi-layered film includes a first electroconductive layer, a dielectric layer, and a second electroconductive layer, which are sequentially layered and disposed on a main surface of a substrate. A lower surface of the dielectric layer comes into contact with an upper surface of the first electroconductive layer, an upper surface and an side surface of the dielectric layer is coated with the second electroconductive layer, and an side end of a portion at which the first electroconductive layer directly overlaps the second electroconductive layer is located inside a side end of the substrate on the main surface of the substrate.

1 Claim, 11 Drawing Sheets

(51) Int. Cl.
*C23C 14/58* (2006.01)
*H01L 41/047* (2006.01)
*H01L 41/297* (2013.01)
*H01L 41/314* (2013.01)

(52) U.S. Cl.
CPC ........ *H01L 41/0471* (2013.01); *H01L 41/297* (2013.01); *H01L 41/314* (2013.01)

(56) References Cited

FOREIGN PATENT DOCUMENTS

| | | |
|---|---|---|
| JP | 2003-081694 | 3/2003 |
| JP | 2005-307245 | 11/2005 |
| JP | 2006-010719 | 1/2006 |
| JP | 2007-327106 | 12/2007 |
| JP | 2009-155683 | 7/2009 |
| JP | 2010-084180 | 4/2010 |
| JP | 2001-328199 | 11/2011 |
| KR | 1020090097211 | 9/2009 |
| KR | 1020130054343 | 5/2013 |
| WO | 2008/084639 | 7/2008 |

OTHER PUBLICATIONS

Office Action from corresponding Japanese Application No. 2016-529293 dated Jan. 30, 2018. English translation attached.
Office Action from related Korean Application No. 10-2016-7034584 dated Dec. 18, 2017. English translation attached.
International Search Report from corresponding PCT Application No. PCT/JP2015/066891 dated Sep. 15, 2015. English translation attached.

* cited by examiner

MULTI-LAYERED FILM, METHOD OF MANUFACTURING THE SAME, AND MANUFACTURING APPARATUS OF THE SAME

TECHNICAL FIELD

The present invention relates to a multi-layered film, a manufacturing method thereof, and a manufacturing apparatus thereof.

This application claims priority from Japanese Patent Application No. 2014-127469 filed on Jun. 20, 2014, the contents of which are incorporated herein by reference in their entirety.

BACKGROUND ART

Currently, a piezo element using a ferroelectric material such as lead zirconate titanate ($Pb(Zr, Ti)O_3$: PZT) is applied to an MEMS (Micro Electro Mechanical Systems) technique such as an inkjet head an acceleration sensor.

Particularly, a PZT film has been attracted attention and actively researched by various organizations (Patent Document 1 to 3).

Various research has been conducted in order to improve withstand voltage characteristics of a PZT film.

Hereinafter, a conventional situation before the invention is achieved will be described.

Firstly, regarding the layered structure shown in FIG. 13, particularly, in the case of manufacturing a layered structure having the first electroconductive layer 3, the dielectric layer 4, and the second electroconductive layer 5 which are sequentially layered therein on a main surface of the substrate 2 so as to coat the entire region of the main surface by use of a sputtering method, it was studied what kind of problems occur.

FIGS. 14A to 14C are cross-sectional views schematically showing steps of forming the layered structure shown in FIG. 13.

FIG. 14A shows a step A of forming the first electroconductive layer 3 on the substrate 2.

FIG. 14B shows a step B of forming the dielectric layer 4 so as to coat the first electroconductive layer 3.

FIG. 14C shows a step C of forming the second electroconductive layer 5 so as to coat the dielectric layer 4.

FIGS. 15A and 15B are cross-sectional schematic views showing a sputtering apparatus used to carry out the analysis.

FIG. 15A is a cross-sectional view showing the entire film formation apparatus.

FIG. 15B shows the relevant part near the substrate 2 in the film forming chamber.

Conventionally, since the layered structure shown in FIG. 13 is formed on a substrate in the steps shown in FIGS. 14A to 14C in order, a substrate 100 (W) is disposed as shown in FIG. 15B.

Specifically, the top surface (a main surface) of a flat plate-shaped substrate W on which films are to be formed faces the target 21, and the back surface of the substrate W (the other main surface) is mounted on the upper surface of a support 101 (S1).

Moreover, a first adhesion-preventing plate 104 is arranged on the region located at the side portion of the substrate W on the upper surface of the support 101 (S1).

The first adhesion-preventing plate 104 functions to prevent a film from being formed on the upper surface of the support 101 (S1).

For this reason, normal film formation is carried out on the entire top surface of the substrate W; however, the phenomenon that sputtered particles pass through a slight space between the side surface of the substrate W and the first adhesion-preventing plate 104 and are adhered to the periphery thereof may occur, and there is a possibility that an unexpected film is formed on not only the side surface of the substrate but also the back surface close to the side surface.

In the case of the adhesion of sputtered particles as mentioned above, after the film formation, it is necessary to provide a superfluous step of removing the portion at which adhesion of the particles occurs, and therefore there is a problem in that manufacturing processes become complicated or the cost of manufacturing increases.

Furthermore, in the case where a layered structure includes a specified layer therein that is made of a film containing "a chemical element having a high vapor pressure (for example, Pb, Mg, Zn, Mn, Li, K, Na, Tl, Sm, Sr, Yb, or the like)", there is also a problem as follows.

Particularly, "a chemical element having a high vapor pressure" is scattered from the specified layer during film formation or after film formation, the element is incorporated into the film other than the specified layer and affects the film characteristics (for example, electrical characteristics, mechanical characteristics, or the like) of the film other than the specified layer. Furthermore, in the case where the layered structure constitutes a device or the like, it is difficult for the characteristics of the device to fall within a desired numerical value range, and there is a possibility that a stabilized manufacturing line cannot be realized.

PRIOR ART DOCUMENTS

Patent Documents

[Patent Document 1] Japanese Unexamined Patent Application, First Publication No. 2007-327106
[Patent Document 2] Japanese Unexamined Patent Application, First Publication No. 2010-084180
[Patent Document 3] Japanese Unexamined Patent Application, First Publication No. 2003-081694

SUMMARY OF INVENTION

Problems to be Solved by the Invention

The invention was made in view of the above-described conventional situations, and has a first object to provide a multi-layered film that has a configuration capable of limiting the effect due to adhesion of sputtered particles to the periphery.

Additionally, the invention has a second object to provide a method of manufacturing a multi-layered film which includes a step of limiting the effect due to adhesion of sputtered particles to the periphery.

Furthermore, the invention has a third object to provide a manufacturing apparatus of a multi-layered film that has a configuration limiting the effect due to adhesion of sputtered particles to the periphery.

Means for Solving the Problems

According to a first aspect of the invention, a multi-layered film includes a first electroconductive layer, a dielectric layer, and a second electroconductive layer, which are sequentially layered and disposed on a main surface of a substrate. A lower surface of the dielectric layer comes into contact with an upper surface of the first electroconductive layer, an upper surface and an side surface of the dielectric layer is coated with the second electroconductive layer, and an side end of a portion at which the first electroconductive layer directly overlaps the second electroconductive layer is located inside a side end of the substrate on the main surface of the substrate.

In the above-described multi-layered film of the first aspect, according to a second aspect of the invention, the dielectric layer may include a chemical element having a high vapor pressure.

In the above-described multi-layered film of the first aspect or the second aspect, according to a third aspect of the invention, the dielectric layer may be made of a piezoelectric material.

According to a fourth aspect of the invention, a method of manufacturing a multi-layered film that includes a first electroconductive layer, a dielectric layer, and a second electroconductive layer, which are sequentially layered and disposed on a main surface of a substrate. The method includes: forming the first electroconductive layer on the substrate so that a side end of the first electroconductive layer is located inside a side end of the substrate and is located further inward than the side end of the substrate on the main surface of the substrate (step A); forming the dielectric layer so as to coat the first electroconductive layer and expose an outer-peripheral end region on a top surface of the first electroconductive layer (step B); forming the second electroconductive layer so as to coat both the dielectric layer and the outer-peripheral end region at which the first electroconductive layer is exposed (step C); and at a desired position that is located inside the outer-peripheral end region of the first electroconductive layer, removing a portion located outside the position from a layered body that is constituted of the first electroconductive layer, the dielectric layer, and the second electroconductive layer (step D).

According to a fifth aspect of the invention, a manufacturing apparatus of a multi-layered film that includes a first electroconductive layer, a dielectric layer, and a second electroconductive layer, which are sequentially layered and disposed on a main surface of a substrate. The apparatus includes: a film forming chamber α that forms the first electroconductive layer and includes a first member having a first opening, the first member being in an internal space of the film forming chamber α, the first opening regulating a surface configuration of the first electroconductive layer; a film forming chamber β that forms the dielectric layer and includes a second member having a second opening, the second member being in an internal space of the film forming chamber β, the second opening regulating a surface configuration of the dielectric layer; and a film forming chamber γ that forms the second electroconductive layer and includes a third member having a third opening, the third member being in an internal space of the film forming chamber γ, the third opening regulating a surface configuration of the second electroconductive layer. When the first electroconductive layer is formed on the substrate, the first opening is disposed so that a side end of the first electroconductive layer is located inside the substrate and is located further inward than the side end of the substrate. When the dielectric layer is formed above the first electroconductive layer, an exposed portion occurs on an outer-peripheral end region on a top surface of the first electroconductive layer. When the second electroconductive layer is formed above the dielectric layer, the second electroconductive layer coats the dielectric layer and the exposed portion of the outer-peripheral end region of the first electroconductive layer. The second opening is smaller than the first opening and the third opening.

Effects of the Invention

In the multi-layered film according to each aspect mentioned above, the first electroconductive layer, the dielectric layer, and the second electroconductive layer are sequentially layered and disposed on the main surface of the substrate.

Furthermore, the structure is adopted in which the lower surface of the dielectric layer comes into contact with the upper surface of the first electroconductive layer, the upper surface and the side surface of the dielectric layer is coated with the second electroconductive layer, and the side end of a portion at which the first electroconductive layer directly overlaps the second electroconductive layer is located inside the side end of the substrate.

Because of this, the dielectric layer is in a state where both the top and back surfaces and the side surface are all sealed.

Additionally, since the side end of the portion at which the first electroconductive layer directly overlaps the second electroconductive layer is located inside the side end of the substrate, even in the case of forming any layer such as a first electroconductive layer, a dielectric layer, and a second electroconductive layer, sputtered particles are not adhered to the side surface or the back surface of the substrate.

Consequently, the invention can provide a multi-layered film capable of avoiding "the effect due to adhesion of sputtered particles to the periphery".

Additionally, in the method of manufacturing a multi-layered film according to each aspect mentioned above, as a result of carry out the aforementioned steps A to C, a dielectric layer is obtained which is in a state where both the top and back surfaces and the side surface are all sealed.

In the step A, the side end of the first electroconductive layer is formed inside the side end of the substrate. In the step B, the side end of the dielectric layer is formed further inside the side end of the first electroconductive layer.

Next, in the step C, the second electroconductive layer is formed so as to contain the dielectric layer.

Consequently, when the first electroconductive layer, the dielectric layer, and the second electroconductive layer are formed, it is difficult for the sputtered particles to be adhered to the side surface or the back surface of the substrate.

Finally, in the step D, at a desired position that is located inside the outer-peripheral end region of the first electroconductive layer, a portion located outside the position is removed, and therefore the effect due to adhesion of sputtered particles to the periphery is reliably avoided even in the case where the sputtered particles are adhered to the side surface or the back surface of the substrate in the A to C.

As a result, the invention can provide a manufacturing method that can obtain a multi-layered film capable of avoiding "the effect due to adhesion of sputtered particles to the periphery" with repeatability.

Furthermore, the manufacturing apparatus of a multi-layered film according to each aspect mentioned above individually includes: the first member having the first opening that regulates a surface configuration of the first electroconductive layer; the second member having the second opening that regulates a surface configuration of the dielectric layer; and the third member having the third opening that regulates a surface configuration of the second electroconductive layer. The magnitude relationship of the first opening, the second opening, and the third opening is determined so that the dielectric layer is in state where both the top and back surfaces and the side surface are all sealed.

As a result, the invention can provide a manufacturing apparatus that can stably obtain a multi-layered film capable of avoiding "the effect due to adhesion of sputtered particles to the periphery" with repeatability.

EMBODIMENTS FOR CARRYING OUT THE INVENTION

Hereinafter, a multi-layered film, a manufacturing method thereof, and a manufacturing apparatus thereof according to one embodiment of the invention will be described with reference to drawings.

Figure 1:
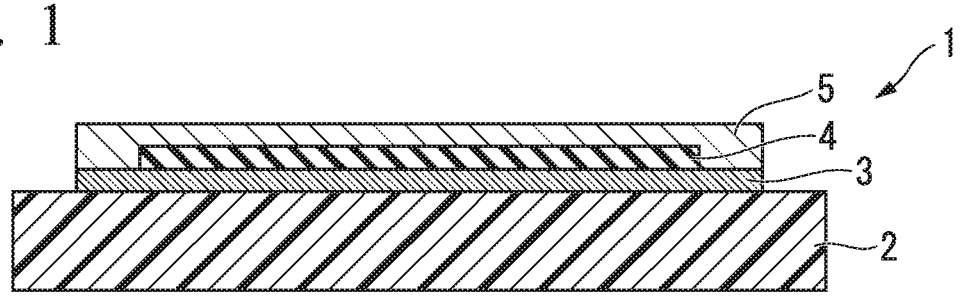
FIG. 1 is a cross-sectional view showing one configuration example of a multi-layered film according to one embodiment of the invention.

FIG. 1 is a cross-sectional view showing one configuration example of a multi-layered film according to the embodiment.

In a multi-layered film 1, a first electroconductive layer 3 made of platinum (Pt), a dielectric layer 4, and a second electroconductive layer 5 made of platinum (Pt) are at least disposed on the main surface of a substrate 2 made of silicon in order.

The dielectric layer 4 is not particularly limited and is made of a ferroelectric material such as lead zirconate titanate (Pb $(Zr_xTi_{1-x})O_3$: PZT), $PbTiO_3$, $BaTiO_3$, PMM-PZT, PNN-PZT, PMN-PZT, PNN-PT, PLZT, PZTN, NBT, or KNN.

They are all piezoelectric materials and preferable.

Among these, in the case where the dielectric layer 4 includes "a chemical element having a high vapor pressure", the multi-layered film according to the embodiment works effectively that can prevent the effect due to adhesion of sputtered particles to the periphery.

As "a chemical element having a high vapor pressure", for example, Pb, Mg, Zn, Mn, Li, K, Na, Tl, Sm, Sr, Yb, or the like is adopted.

Regarding the dielectric layer 4, the lower surface of the dielectric layer 4 comes into contact with the upper surface of the first electroconductive layer 3, and the upper surface and the side surface of the dielectric layer 4 are coated with the second electroconductive layer 5.

Additionally, the portion at which the first electroconductive layer 3 directly overlaps the second electroconductive layer 5 is present the region located further outward than the outer-peripheral end of the dielectric layer 4 on the main surface of the substrate 2.

Furthermore, the side end of the portion is located inside the side end of the substrate 2.

Consequently, the dielectric layer 4 is in a state where both the top and back surfaces and the side surface are all sealed.

Moreover, since the side end of the portion at which the first electroconductive layer 3 directly overlaps the second electroconductive layer 5 is located inside the side end of the substrate, even in the case of forming any layer such as a first electroconductive layer 3, a dielectric layer 4, and a second electroconductive layer 5, it is difficult for sputtered particles to be adhered to the side surface or the back surface of the substrate 2.

Accordingly, the multi-layered film 1 is obtained which can prevent "the effect due to adhesion of sputtered particles to the periphery".

In the case where the dielectric layer 4 includes a chemical element having a high vapor pressure, particularly, the multi-layered film 1 having the configuration shown in FIG. 1 works effectively.

Sputtered particles including a chemical element having a high vapor pressure have the characteristics of easily adhering to the side surface or the back surface of the substrate 2.

However, since the dielectric layer 4 is in a state where both the top and back surfaces and the side end thereof are sealed, a chemical element having a high vapor pressure cannot scattered to the outside from the dielectric layer 4 after film formation.

For this reason, in the case where the dielectric layer 4 includes a chemical element having a high vapor pressure, the multi-layered film 1 having the structure shown in FIG. 1 exhibits a significant effect.

In the case where the dielectric layer is made of a piezoelectric material, it is necessary to pay attention to "the effect due to adhesion of sputtered particles to the periphery".

It is necessary to carry out a superfluous step of removing the portion at which adhesion of the particles occurs on the substrate 2 on which the multi-layered film 1 is formed.

This results in an increase in manufacturing time and the cost of manufacturing and becomes a factor that causes a decrease in yield.

In contrast, according to the multi-layered film 1 having the configuration shown in FIG. 1, in the case where the dielectric layer is made of a piezoelectric material, the multi-layered film effectively functions to limit sputtered particles from being adhered to the periphery.

As described above, the multi-layered film 1 according to the embodiment has the configuration capable of limiting the effect due to adhesion of sputtered particles to the periphery.

In the multi-layered film 1 that is not affected by adhesion of sputtered particles, various layers thereof having a desired film composition are entirely and uniformly layered therein from the center to the side end.

Therefore, a desired multi-layered film 1 is obtained at all positions which are from the center to the side end on the main surface of the substrate 2.

When the portion at which the first electroconductive layer 3 directly overlaps the second electroconductive layer 5 is removed from the above-described multi-layered film 1, the configuration is obtained which has the first electroconductive layer 3, the dielectric layer 4, and the second electroconductive layer 5, which are sequentially stacked on the main surface of the substrate 2.

That is, the multi-layered film 1 including the dielectric layer 4 having a desired film composition is obtained without depending on the positions (the center or near the outer-peripheral end) of one substrate 2.

Consequently, chips having excellent characteristics such as high piezoelectricity and high voltage resistance are stably obtained.

The foregoing multi-layered film 1 is preferably used in, for example, a piezo element or the like.

The multi-layered film 1 is formed by the manufacturing method described below.

Figure 2A:
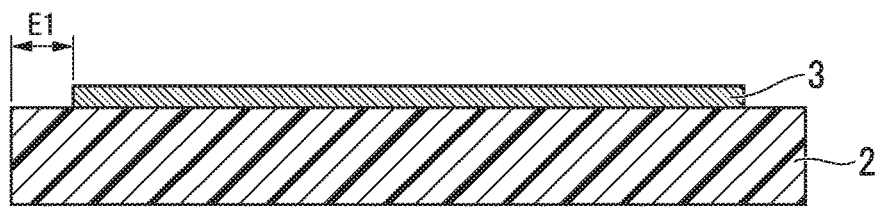
FIG. 2A is a cross-sectional view showing a process of manufacturing the multi-layered film according to the embodiment.
Figure 2B:
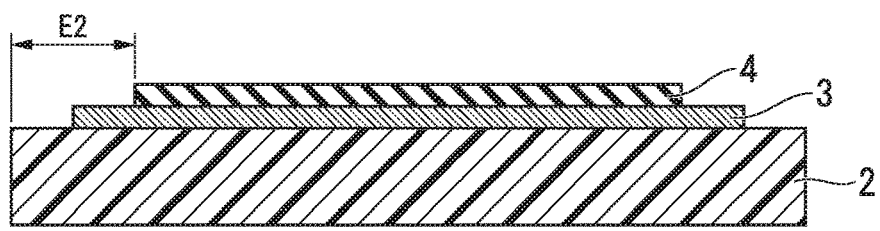
FIG. 2B is a cross-sectional view showing a process of manufacturing the multi-layered film according to the embodiment.
Figure 2C:
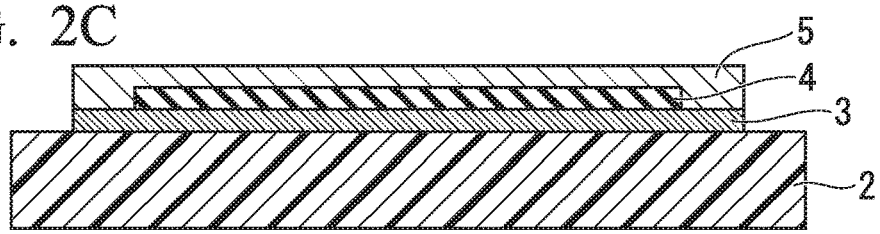
FIG. 2C is a cross-sectional view showing a process of manufacturing the multi-layered film according to the embodiment.

FIGS. 2A to 2C are cross-sectional views showing steps of manufacturing the multi-layered film according to the embodiment.

The manufacturing method according to the embodiment is a method of manufacturing a multi-layered film that has the first electroconductive layer 3, the dielectric layer 4, and the second electroconductive layer 5 which are sequentially layered on the main surface of the substrate 2, and the method includes at least four steps A to step D in series which are described below.

In the step A, on the main surface of the substrate 2, the first electroconductive layer 3 is formed on the substrate 2 so that the side end of the first electroconductive layer 3 is located inside the side end of the substrate 2 (FIG. 2A).

Consequently, the first electroconductive layer 3 is not present on the region E1 from the side end of the substrate 2, and this region is formed of the portion at which the main surface of the substrate 2 is exposed.

In the step B, the dielectric layer 4 is formed so as to coat the first electroconductive layer 3 and so that the outer-peripheral end region is exposed on the surface of the first electroconductive layer 3 (FIG. 2B).

Consequently, both the first electroconductive layer 3 and the dielectric layer 4 are not present on the region E2 from the side end of the substrate 2, and this region is formed of: the portion at which the main surface of the substrate 2 is exposed; and the portion at which only the dielectric layer 4 is not present and the first electroconductive layer 3 is exposed.

In the step C, the second electroconductive layer 5 is formed so as to coat the dielectric layer 4 and the outer-peripheral end region at which the first electroconductive layer 3 is exposed (FIG. 2C).

Consequently, all of the first electroconductive layer 3, the dielectric layer 4, and the second electroconductive layer 5 are not present on the region E1 from the side end of the substrate 2, and this region is formed of the portion at which the main surface of the substrate 2 is exposed.

Figure 2D:
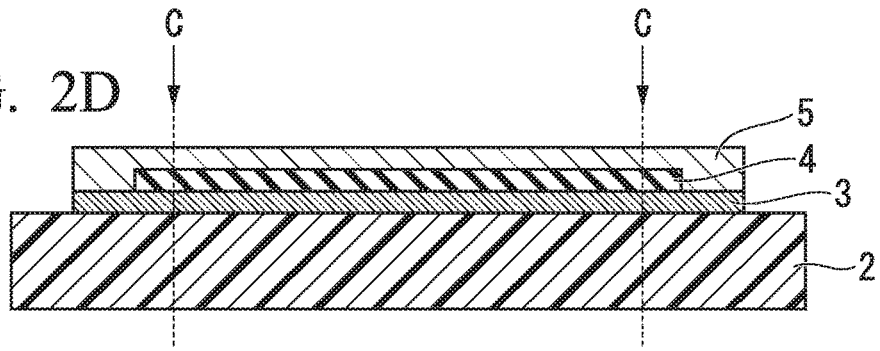
FIG. 2D is a cross-sectional view showing a process of manufacturing the multi-layered film according to the embodiment.

In the step D, at a desired position C that is located inside the outer-peripheral end region of the first electroconductive layer 3, the portion located outside the position C is removed from the layered body constituted of the first electroconductive layer 3, the dielectric layer 4, and the second electroconductive layer 5 (FIG. 2D).

As a result of carrying out the steps A and B, the side end of the first electroconductive layer 3 and the side end of the dielectric layer 4 are sequentially displaced formed in a direction from the side end of the substrate 2 to the center of the substrate 2.

That is, the main surface of the substrate 2, the surface of the first electroconductive layer 3, and the surface of the dielectric layer 4 form a stepwise shape at the side ends.

Next, in the step C, the second electroconductive layer 5 is formed so as to coat not only the dielectric layer 4 but also the region at which the side end of the first electroconductive layer 3 and the side end of the dielectric layer 4 are displaced, that is, the outer-peripheral end region at which the first electroconductive layer 3 is exposed.

Accordingly, as shown in FIG. 2C, the dielectric layer 4 is in a state where both the top and back surfaces and the side surface are all sealed by the first electroconductive layer 3 and the second electroconductive layer 5.

Subsequently, in the step D, at the desired position C that is located inside the outer-peripheral end region of the first electroconductive layer 3, the portion located outside the position C is removed from the layered body constituted of the first electroconductive layer 3, the dielectric layer 4, and the second electroconductive layer 5.

FIG. 2D shows an example of removing both the layered body and the substrate 2 are removed together; however, the layered body may be only removed while leaving the substrate 2.

Regarding whether or not removal of the substrate 2 is carried out, a preferred configuration is appropriately selected in a post-process.

Particularly, as "a method of removing the portion at which the first electroconductive layer 3 directly overlaps the second electroconductive layer 5", for example, not only a method of removing only the structural body constituted of the first electroconductive layer 3, the dielectric layer 4, and the second electroconductive layer 5 by etching or photolithography but also a method of removing both the structural body and the substrate 2 by dicing, or the like are adopted.

In the resultant multi-layered film 1, during film formation or after film formation, adhesion of sputtered particles is prevented, even in the case where adhesion of sputtered particles occurs, the portion at which the adhesion of sputtered particles occurs is reliably removed.

Consequently, according to the invention, it is possible to provide a method of manufacturing the multi-layered film in which the adhesion of sputtered particles is prevented.

In the following explanation, as an example, the case will be described where lead zirconate titanate (Pb (Zr, Ti,)O$_3$: PZT) is used as the dielectric layer 4; however, the invention is not limited to this.

(Film Formation Apparatus)

Hereinbelow, the configuration of a preferred film formation apparatus in order to carry out the method of manufacturing a multi-layered film according to the embodiment will be described.

Figure 3A:
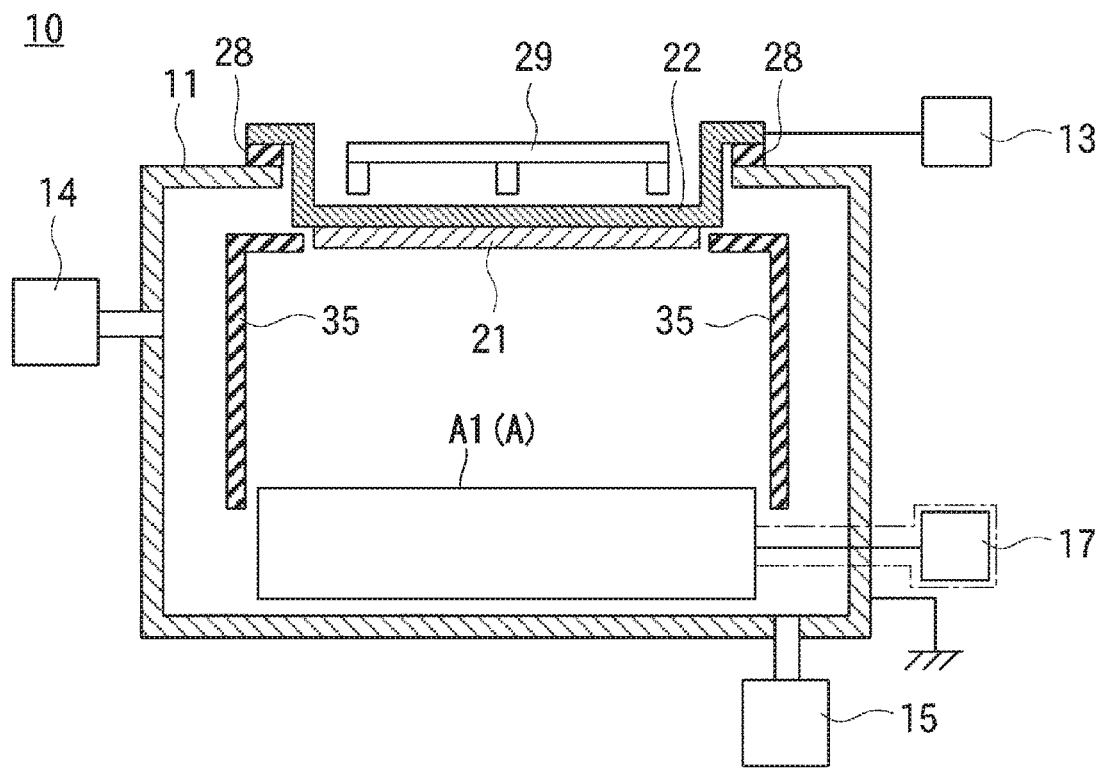
FIG. 3A is a view schematically showing an example of a film formation apparatus used in the embodiment.
Figure 3B:
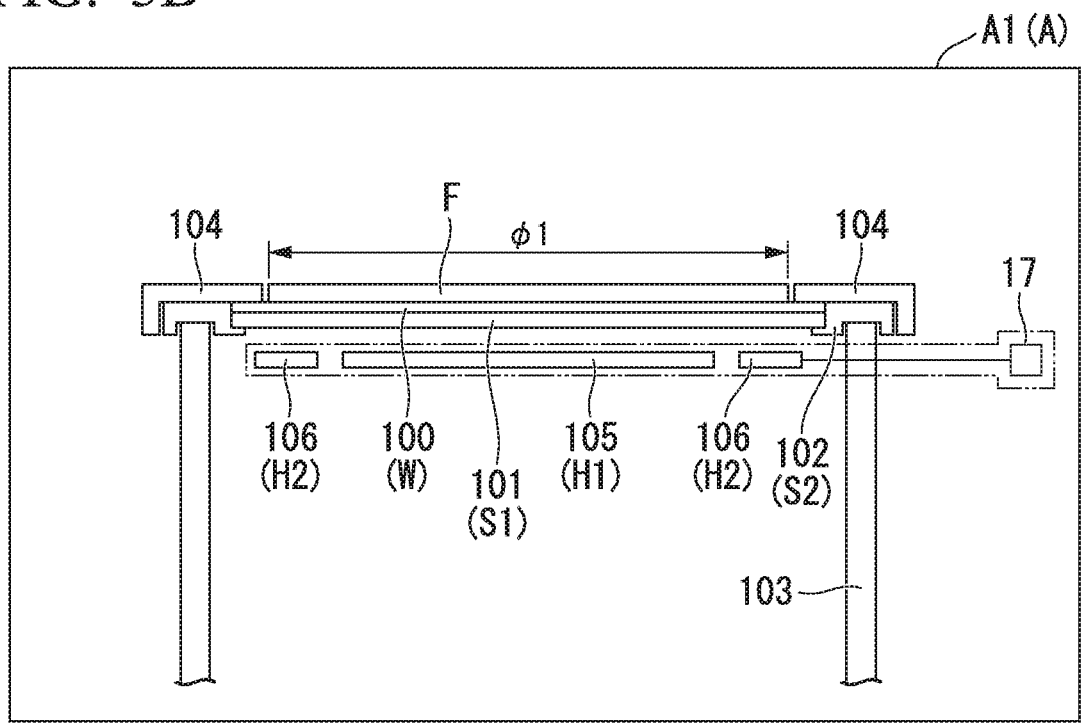
FIG. 3B is a view schematically showing an example of a film formation apparatus used in the embodiment.

FIGS. 3A and 3B are schematic cross-sectional views showing an example of a film formation apparatus used in the embodiment.

FIG. 3A is a cross-sectional view showing the entire internal constitution of the film formation apparatus.

FIG. 3B is a cross-sectional view showing the relevant part of the periphery A on which a substrate is mounted.

The film formation apparatus shown in FIGS. 3A and 3B is used to form the first electroconductive layer 3 and the second electroconductive layer 5 in the case of forming the multi-layered film shown in FIG. 1.

The film formation apparatus 10 includes: a vacuum chamber 11; a target 21; a first support (S1) 101; temperature controllers (H1, H2), 105, and 106; a sputtering power supply 13; a sputtering gas introduction unit 14; a first adhesion-preventing plate 104; and a second adhesion-preventing plate 35.

The target 21 is disposed in the vacuum chamber 11.

The first support (S1) is disposed at the position facing to the target 21 and is configured to mount a substrate (W) 100 thereon.

The temperature controllers (H1, H2) control a substrate temperature by heating or cooling the substrate (W) mounted on the first support (S1).

The sputtering power source 13 is configured to apply a voltage to the target 21.

The sputtering gas introduction unit 14 is configured to introduce a sputtering gas into the vacuum chamber 11.

The first adhesion-preventing plate 104 and the second adhesion-preventing plate 35 are disposed in the vacuum chamber 11 at the positions to which particles emitted from the target 21 are attached.

The bottom surface of the outer-peripheral region of the first support (S1) is supported by the second support (S2) 102.

The second support (S2) is fixed to the bottom surface of the vacuum chamber 11 via a support pillar 103.

The first adhesion-preventing plate 104 shown in FIG. 3B covers the upper surface and the outer side surface of the second support (S2), is arranged so as to cover the region (referred to as an edge cutting region 1) from the outer-peripheral end of the substrate (W) at a predetermined distance (E1), and functions as an edge cut member.

For this reason, in the embodiment, the first adhesion-preventing plate 104 is referred to as an edge cut member X (first member, third member).

The first adhesion-preventing plate 104 is made of, for example, ceramics such as quartz or alumina.

Since the film-formation target surface of the substrate (W) (upper surface shown in FIG. 3B) that is located (shaded) under the first adhesion-preventing plate 104 is shielded from sputtered particles, the sputtered particles are prevented from being adhered thereto.

In contrast, the area in which the edge cut member X formed of the first adhesion-preventing plate 104 is not present, that is, the region corresponding to the opening φ1 shown in FIG. 3B is provided in a space above the film-formation target surface of the substrate (W) (upper surface shown in FIG. 3B) located inside the first adhesion-preventing plate 104. Therefore, sputtered particles passing through the opening φ1 are deposited on the film-formation target surface of the substrate (W).

Because of this, in the film formation apparatus having the configuration shown in FIGS. 3A and 3B, the first electroconductive layer 3 or the second electroconductive layer 5 which has a surface shape corresponding to the opening φ1 is formed on the film-formation target surface of the substrate (W).

In FIG. 3B, reference numeral F represents a film (the first electroconductive layer 3 or the second electroconductive layer 5) formed on the film-formation target surface of the substrate (W).

That is, in the case of applying it to formation of the first electroconductive layer 3, a state where the layers shown in FIG. 2A is obtained.

In the case of applying it to formation of the second electroconductive layer 5, a state where the layers shown in FIG. 2C is obtained.

The second adhesion-preventing plate 35 is made of quartz or ceramics such as alumina.

The second adhesion-preventing plate 35 is formed in a cylindrical shape such that the inner-periphery of the second adhesion-preventing plate 35 is larger than the outer-periphery of the target 21 or the outer-periphery of the substrate (W).

The second adhesion-preventing plate 35 is arranged between the first support (S1), the second support (S2), and a cathode electrode 22 and is configured to surround the side region of the space between the substrate (W) and the target 21.

For this reason, the particles discharged from the target 21 are prevented from being adhered to the wall surface of the vacuum chamber 11.

A cathode electrode 22 is disposed at the upper wall surface of the vacuum chamber 11 with an insulating member 28 interposed therebetween, and the cathode electrode 22 is electrically insulated from the vacuum chamber 11.

The vacuum chamber 11 has a ground potential.

One of the surfaces of the cathode electrode 22 is locally exposed to the inside of the vacuum chamber 11.

The target 21 is brought into close contact with and fixed to the center portion of the exposed region of the surface of the cathode electrode 22, and the target 21 is electrically connected to the cathode electrode 22.

The sputtering power source 13 is disposed outside the vacuum chamber 11.

The sputtering power source 13 is electrically connected to the cathode electrode 22 and is capable of applying an alternating voltage to the target 21 through the cathode electrode 22.

A magnet device 29 is disposed on the cathode electrode 22 on the opposite side of the target 21, that is, on the other side of the cathode electrode 22.

The magnet device 29 is configured to form magnetic field lines on the surface of the target 21.

the first support (S1) on which the substrate (W) is to be mounted is made of, for example, carburization silicon (SiC).

The size of the outer-periphery of the first support (S1) is substantially the same as that of the outer-periphery of the substrate 31.

The surface of the first support (S1) is arranged so as to face the surface of the target 21.

Consequently, the film-formation target surface of the substrate 31 that is mounted on the first support (S1) is also disposed so as to face the surface of the target 21.

The means which electrostatically attracts the substrate (W) is located inside the first support (S1).

As the substrate (W) is mounted on and electrostatically attracted to The surface (upper surface shown in FIG. 3B) of the first support (S1), the back surface of the substrate (W) is brought into close contact with the surface of the first support (S1), and the substrate (W) is thermally connected to the first support (S1).

Most of the back surface of the first support (S1) (lower surface shown in FIG. 3B) faces the temperature controllers (H1, H2), 105, and 106 which are separately arranged and will be described later.

The remaining portion the back surface (lower surface shown in FIG. 3B) of the first adhesion-preventing plate 104, that is, the bottom surface of the outer-peripheral region is held by the second support (S2).

For example, the temperature controller shown in FIG. 3B is configured to include a center temperature controller (H1) 105 and an outer-peripheral temperature controller (H2) 106, each of which can independently control a temperature.

The temperature controller is separated into two, that is, the center temperature controller (H1) 105 and the outer-peripheral temperature controller (H2) 106. In this configuration that carries out independent control, for example, a temperature of the outer-periphery has a tendency to be lower than a temperature of the center. Therefore, as a result of setting the temperature of the outer-periphery to be higher than the temperature of the center, it is advantageous to be able to control a temperature so as to obtain a uniform temperature profile in a direction from the center of the substrate (W) to the outer-peripheral end thereof.

Since the temperature controllers (H1, H2), 105, and 106 are arranged separately from the back surface of the first support (S1), the back surface of the first support (S1) is indirectly temperature-controlled by the temperature controllers (H1, H2), 105, and 106, and furthermore the substrate (W) that is mounted on the top surface of the first support (S1) is similarly temperature-controlled.

The temperature controllers (H1, H2), 105, and 106 each includes: a heat generation member built therein (not shown in the figure); and a heating power source 17.

As a material used to form the heat generation member, SiC is used.

The heat generation member is placed at the position on the opposite side of the substrate (W) with the first support (S1) interposed therebetween.

The heating power source 17 is electrically connected to the heat generation member.

When a direct current is supplied to the heat generation member from the heating power source 17, the heat generated from the heat generation member is transmitted through the first support (S1) to the substrate (W) mounted on the first support (S1) and the first adhesion-preventing plate 104.

Therefore, the temperatures of the substrate (W) and the first adhesion-preventing plate 104 are controlled together.

Moreover, a cooling unit (not shown in the figure) may be disposed on the opposite side of the first support (S1) with a heat generation built in the temperature controllers (H1, H2), 105, and 106 interposed therebetween, that is, under the temperature controllers (H1, H2), 105, and 106.

For example, as a result of adopting the configuration that can circulate a temperature-controlled cooling medium in the internal side of the cooling unit, even where the heat generation member is heated, the wall of the vacuum chamber 11 is prevented from being heated.

The sputtering gas introduction unit 14 is connected to the inside of the vacuum chamber 11 and is configured to be able to introduce a sputtering gas into the inside of the vacuum chamber 11.

Figure 4A:
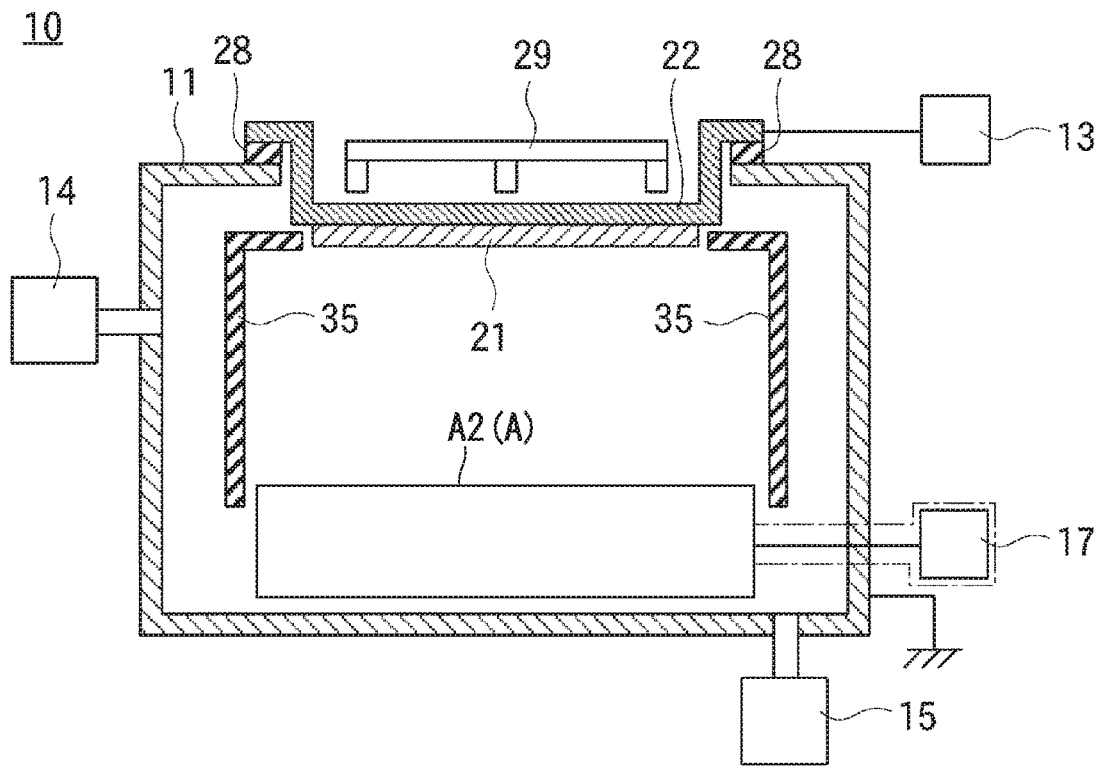
FIG. 4A is a view schematically showing another example of a film formation apparatus used in the embodiment.
Figure 4B:
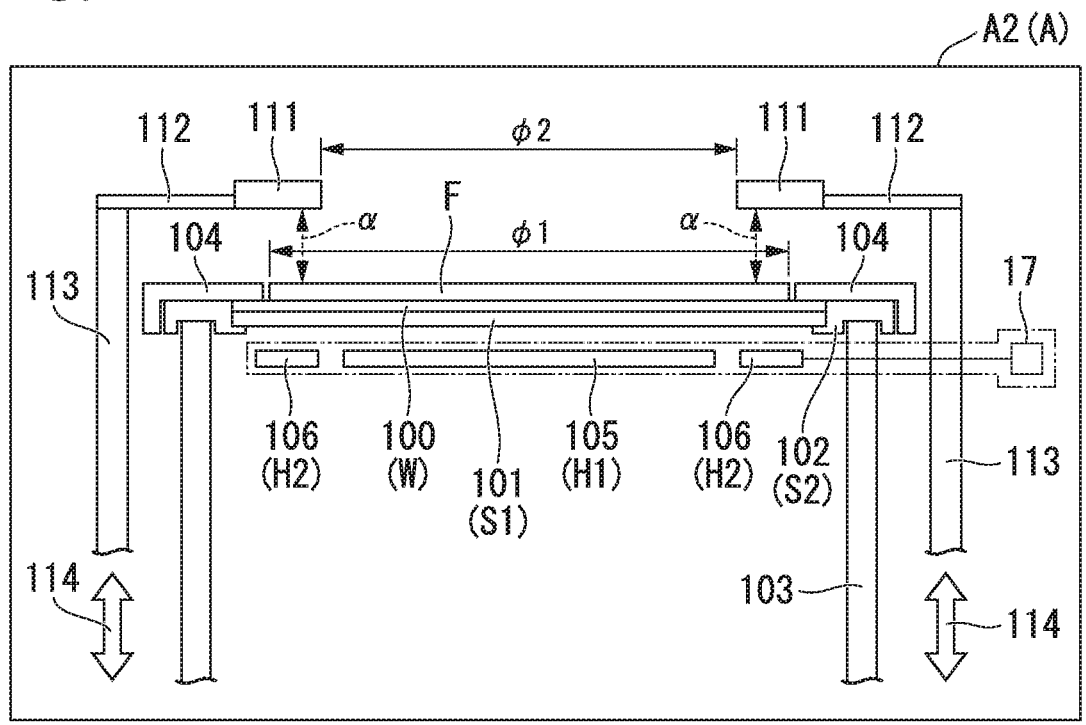
FIG. 4B is a view schematically showing another example of a film formation apparatus used in the embodiment.

FIGS. 4A and 4B are views schematically showing another example of a film formation apparatus used in the embodiment.

FIG. 4A is a cross-sectional view showing the entire internal constitution of the film formation apparatus.

FIG. 4B is a cross-sectional view showing the relevant part of the periphery A on which a substrate is mounted.

The film formation apparatus shown in FIGS. 4A and 4B is used to form the dielectric layer 4 provided between the first electroconductive layer 3 and the second electroconductive layer 5 in the case of forming the multi-layered film shown in FIG. 1.

Hereinbelow, only the elements which are different from the film formation apparatus shown in FIGS. 3A and 3B will be described, and the explanations of the same elements are omitted here.

The film formation apparatus shown in FIGS. 4A and 4B is different from the film formation apparatus shown in FIGS. 3A and 3B in the structure represented by reference numerals 111 to 114.

Similar to the first adhesion-preventing plate 104, the third adhesion-preventing plate 111 shown in FIG. 4B functions as an edge cut member.

For this reason, in the embodiment, the third adhesion-preventing plate 111 is referred to as an edge cut member Y (second member).

However, as described below, the region which will be edge-cut is different from the above mentioned.

Particularly, the edge cut member Y formed of the third adhesion-preventing plate 111 is arranged so as to coat the upper surface of the edge cut member X formed of the first adhesion-preventing plate 104 and cover the region (referred to as an edge cutting region 2) from the outer-peripheral end of the substrate (W) at a predetermined distance (E2).

Here, the relationship between the predetermined distance (E2) and the aforementioned predetermined distance (E1) is designed so as to be E2>E1.

That is, the film-formation target surface of the substrate (W) (upper surface shown in FIG. 4B) located (shaded) under the edge cut member Y formed of the third adhesion-preventing plate 111 is wider than the edge cut member X formed of the first adhesion-preventing plate 104.

The third adhesion-preventing plate 111 is made of, for example, ceramics such as quartz or alumina.

Since the film-formation target surface of the substrate (W) (upper surface shown in FIG. 4B) that is located (shaded) under the third adhesion-preventing plate 111 is shielded from sputtered particles, the sputtered particles are prevented from being adhered thereto.

In contrast, the area in which the edge cut member Y formed of the third adhesion-preventing plate 111 is not present, that is, the region corresponding to the opening φ2 shown in FIG. 4B is provided in a space above the film-formation target surface of the substrate (W) (upper surface shown in FIG. 4B) located inside the third adhesion-preventing plate 111. Therefore, sputtered particles passing through the opening φ2 are deposited on the film-formation target surface of the substrate (W).

In the embodiment, since the first electroconductive layer 3 is formed on the substrate in advance, the dielectric layer 4 is deposited on the first electroconductive layer 3.

In the configuration example shown in FIGS. 4A and 4B, the third adhesion-preventing plate 111 is supported by arms 112 provided above the support pillar 113.

The support pillar 113 includes a mechanism 114 that moves upward and downward.

As the support pillar 113 moves upward and downward, as seen from the film-formation target surface of the substrate (W), it is possible to vary the height α of the third adhesion-preventing plate 111.

In the case where the back surface (lower surface shown in FIG. 4B) of the third adhesion-preventing plate 111 comes close to the surface of the film F and is stopped, the dielectric layer 4 is formed on the first electroconductive layer 3.

Because of this, in the film formation apparatus having the configuration shown in FIGS. 4A and 4B, the dielectric layer 4 which has a surface shape corresponding to the opening φ2 is formed on the first electroconductive layer 3 that is previously formed on the main surface of the substrate (W).

In FIG. 4B, reference numeral F represents a film that is formed on the film-formation target surface of the substrate (W) in advance (the first electroconductive layer 3).

That is, in the case of applying it to formation of the dielectric layer 4, a state where the layers shown in FIG. 2B is obtained.

Particularly, in the case of forming a PZT film (5 to $10 \times 10^{-6}$ (1/K)) as the dielectric layer 4, a preferred material used to form the aforementioned edge cut member X (the first adhesion-preventing plate 104) or the edge cut member Y (the third adhesion-preventing plate 111) is selected in consideration of the following three viewpoints.

First, a material having a high degree of insulation is preferable, and preferably has a specific resistance of $10^8$ (Ω/cm) or more.

Specifically, cordierite, quartz, silicon nitride, carburization silicon, aluminum nitride, mullite (compound of aluminum oxide and silicon dioxide), alumina (aluminum oxide), yttria, sapphire, steatite (ceramics having a crystal $MgO$—$SiO_2$ as a main body), zirconia, or the like is adopted.

Second, a material having a high degree of resistance to thermal shock is preferable, and preferably has a resistance to thermal shock of 200° C. or more.

Specifically, cordierite, quartz, silicon nitride, carburization silicon, aluminum nitride, mullite, sapphire, zirconia, or the like is adopted.

Third, a material having a coefficient of thermal expansion equal to that of a PZT film is preferable, and preferably has a coefficient of thermal expansion of approximately 2 to $20 \times 10^{-6}$ (1/K).

Specifically, silicon nitride, carburization silicon, aluminum nitride, mullite, alumina, yttria, sapphire, steatite, zirconia, or the like is adopted.

That is, as the member satisfying the above-mentioned three points, silicon nitride and carburization silicon are selected.

In the film formation apparatus according to the embodiment, silicon nitride or carburization silicon is used as a member that constitutes the edge cut member X (the first adhesion-preventing plate 104) and the edge cut member Y (the third adhesion-preventing plate 111), and various experimental examples which will be described later were carried out.

Regarding the film formation apparatus described above, the case is described where the film formation apparatus shown in FIGS. 3A and 3B is different from the formation apparatus shown in FIGS. 4A and 4B film.

In this case, it is preferable to form a multi-layered film in a decompressed atmosphere.

For example, a multi-chamber configuration may be adopted in which a communicating unit is provided between the vacuum chamber of the film formation apparatus shown in FIGS. 3A and 3B and the vacuum chamber of the film formation apparatus shown in FIGS. 4A and 4B, and the substrate (W) can be transferred through the communicating unit between both vacuum chambers by a transfer means.

However, in the configuration shown in FIGS. 4A and 4B, for example, in the case of further providing a mechanism (not shown in the figure) that transfers the edge cut member Y formed of the third adhesion-preventing plate 111 in depth direction of the paperface, it is also possible to provide the edge cut member X formed of the first adhesion-preventing plate 104 and the edge cut member Y formed of the third adhesion-preventing plate 111 in the same vacuum chamber 11.

That is, the film formation apparatus according to the embodiment may be a configuration including a single vacuum chamber.

Figure 5A:
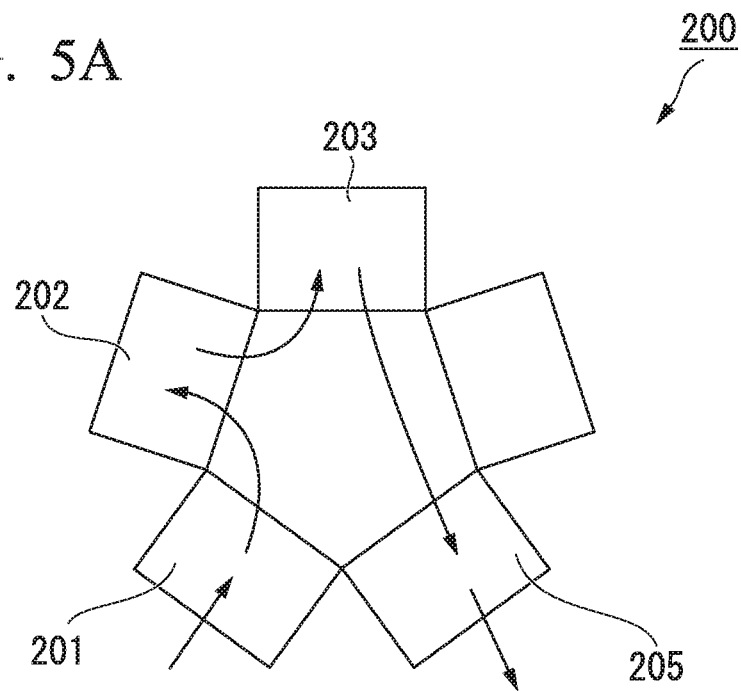
FIG. 5A is a view schematically showing an example of a film formation apparatus having film forming chambers which are individually disposed with a transfer chamber interposed therebetween.
Figure 5B:
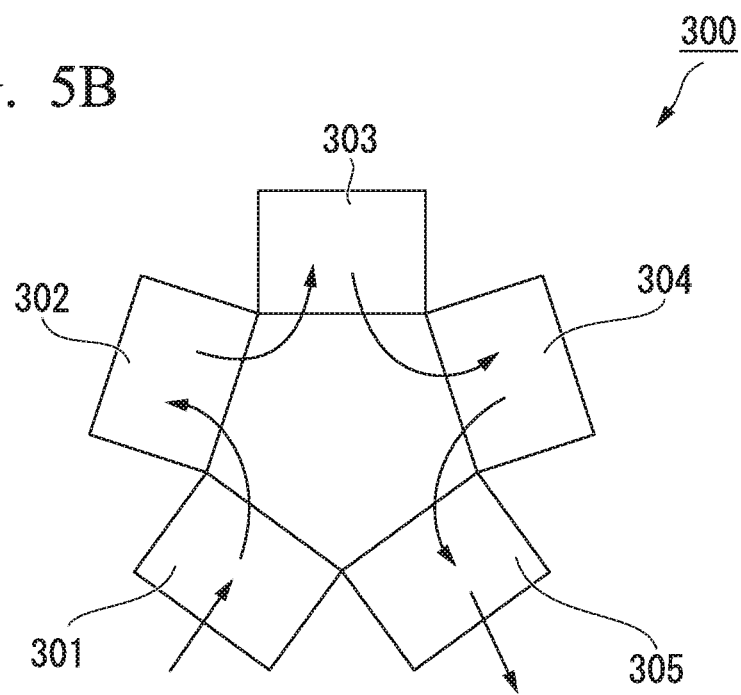
FIG. 5B is a view schematically showing an example of a film formation apparatus having film forming chambers which are individually disposed with a transfer chamber interposed therebetween.

FIGS. 5A and 5B are views schematically showing examples of a multi-chamber in which vacuum chambers (film forming chamber, chamber) are individually disposed with a transfer chamber interposed therebetween.

In the case of forming the multi-layered film according to the embodiment by use of a multi-chamber 200 shown in FIG. 5A, for example, formation of the first electroconductive layer 3 and the dielectric layer 4 are carried out in a chamber 202, and formation of the second electroconductive layer 5 is carried out in a chamber 203.

A transfer pathway of the substrate (W) to be processed will be described.

Firstly, the substrate (W) is transferred from the outside to a load chamber 201.

Subsequently, the substrate (W) waits ready for a predetermined time in the load chamber 201 and thereafter is transferred from the load chamber 201 to the chamber 202.

As described with reference to FIGS. 3A and 3B, the first electroconductive layer 3 is formed on a main surface of the substrate (W) in the chamber 202.

Continuously, as described with reference to FIGS. 4A and 4B, the dielectric layer 4 is formed above the first electroconductive layer 3 in the chamber 202.

Next, the substrate (W) on which the first electroconductive layer 3 and the dielectric layer 4 are formed is transferred from the chamber 202 to the chamber 203.

As described with reference to FIGS. 3A and 3B, the second electroconductive layer 5 is formed above the dielectric layer 4 in the chamber 203.

After that, the substrate (W) on which the multi-layered film configured to include the first electroconductive layer 3, the dielectric layer 4, and the second electroconductive layer 5 is formed is transferred from the chamber 203 to a unload chamber 205, waits ready for a predetermined time, and thereafter is transferred from the unload chamber 205 to the outside.

In the case of forming the multi-layered film according to the embodiment by use of a multi-chamber 300 shown in FIG. 5B, for example, formation of the first electroconductive layer 3 is carried out in a chamber 302, formation of the dielectric layer 4 is carried out in a chamber 303, and formation of the second electroconductive layer 5 is carried out in a chamber 304.

A transfer pathway of the substrate (W) to be processed will be described.

Firstly, the substrate (W) is transferred from the outside to a load chamber 301.

Subsequently, the substrate (W) waits ready for a predetermined time in the load chamber 301 and thereafter is transferred from the load chamber 301 to the chamber 302.

As described with reference to FIGS. 3A and 3B, the first electroconductive layer 3 is formed on a main surface of the substrate (W) in the chamber 302.

After that, the substrate (W) on which the first electroconductive layer 3 is formed is transferred from the chamber 302 to the chamber 303.

Continuously, as described with reference to FIGS. 4A and 4B, the dielectric layer 4 is formed above the first electroconductive layer 3 in the chamber 303.

Next, the substrate (W) on which the first electroconductive layer 3 and the dielectric layer 4 are formed is transferred from the chamber 303 to the chamber 304.

As described with reference to FIGS. 3A and 3B, the second electroconductive layer 5 is formed above the dielectric layer 4 in the chamber 304.

After that, the substrate (W) on which the multi-layered film configured to include the first electroconductive layer 3, the dielectric layer 4, and the second electroconductive layer 5 is formed is transferred from the chamber 304 to a unload chamber 305, waits ready for a predetermined time, and thereafter is transferred from the unload chamber 305 to the outside.

(Method of Forming Multi-layered Film)

Hereinbelow, a method of forming a multi-layered film by use of the aforementioned film formation apparatus of a multi-layered film shown in FIGS. 3A, 3B, 4A, and 4B will be described.

FIGS. 2A to 2E are cross-sectional views showing steps of manufacturing the multi-layered film according to the embodiment.

Each of FIGS. 3A to 4B shows an example of the case where the film formation apparatus 10 includes one vacuum chamber 11 in order to simplify the explanation thereof; however, in the manufacturing method including the steps A to C which will be described below, the case is explained where the film formation apparatus that is configured to include at least three vacuum chambers 11a, 11b, and 11c (11) is used. The vacuum chambers are communicated with each other via an isolation valve which is not shown in the figure in the paperface depth direction in FIG. 3A.

Here, the vacuum chamber 11a (11) is a vacuum chamber that is used to form a first electroconductive layer.

The vacuum chamber 11b (11) is a vacuum chamber that is used to form a dielectric layer.

The vacuum chamber 11c (11) is a vacuum chamber that is used to form a second electroconductive layer.

In the following explanation, the vacuum chambers are discriminated by reference numerals, and members associated with each vacuum chamber are not discriminated by reference numerals.

(Step A): Formation of First Electroconductive Layer

As shown in FIG. 2A, the first electroconductive layer 3 made of platinum (Pt) is formed on a main surface of the substrate 2 made of silicon (Si).

Hereinbelow, the case of directly forming a first electroconductive layer on the main surface side of the substrate will be described.

If required, before forming the first electroconductive layer, the other film may be provided on the main surface side of the substrate 2.

The pressure of the internal space of the vacuum chamber 11a (11) in which a target serving as the target 21a (21) and made of Pt is disposed is reduced by use of a vacuum pump 15.

Consequently, the internal space of the vacuum chamber 11a (11) is in a state of having a high degree of vacuum that is higher than the degree of vacuum atmosphere in which a film is formed.

After that, the vacuum pumping is continuously carried out and the vacuum atmosphere in the vacuum chamber 11 is thereby maintained.

While maintaining the vacuum atmosphere in the vacuum chamber 11, the substrate 31 on which films are to be formed in the internal space of the vacuum chamber 11a (11) is transferred thereto through an inlet which is not shown in the figure.

Subsequently, the substrate (W) is held on the center region of the first support (S1) so that the main surface side of the substrate 31 faces the sputtering surface of the target 21.

The temperature-controlled cooling medium circulates in the cooling unit (not shown in the figure) in advance.

Next, in a step of forming a first electroconductive layer, while the substrate (W) is maintained in a film deposition temperature by use of the temperature controllers (H1, H2), 105, and 106, an Ar gas serving as a sputtering gas is introduced into the inside of the vacuum chamber 11 from the sputtering gas introduction unit 14, an alternating voltage is applied from the sputtering power source 13 to the cathode electrode 22, and Pt target is thereby sputtered.

Consequently, the first electroconductive layer 3 made of Pt is formed on the main surface side of the substrate 31.

At this time, as the relative positional relationship between the substrate (W) and the first adhesion-preventing plate 104, the configuration shown in FIG. 3B is adopted.

(Step B): Formation of Dielectric Layer

As shown in FIG. 2B, the first electroconductive layer 3 is formed so as to coat the dielectric layer 4.

In the step B, a PZT film serving as the dielectric layer 4 is formed by a sputtering method.

A PZT target serving as the target 21 is disposed in the vacuum chamber 11b (11), the pressure of the internal space of the vacuum chamber is previously reduced by the vacuum pump 15, and the internal space of the vacuum chamber is in a vacuum state of having a high degree of vacuum that is higher than the degree of vacuum atmosphere in which a film is formed.

While maintaining the vacuum atmosphere in the vacuum chamber 11b (11), the substrate 31 on which the first electroconductive layer 3 is provided in advance is transferred from the vacuum chamber 11a (11) to the internal space of the vacuum chamber 11b (11).

Subsequently, the substrate (W) is held on the center region of the surface of the first support (S1) so that the main surface of the substrate 31, that is, the first electroconductive layer 3 faces the sputtering surface of the PZT target 21.

After that, while maintaining the substrate (W) at a film deposition temperature, Ar gas and oxygen gas serving as a sputtering gas are introduced into the inside of the vacuum chamber 11b (11) from the sputtering gas introduction unit 14, and the PZT target is sputtered by applying an alternating voltage to the cathode electrode 22 from the sputtering power source 13.

Consequently, the dielectric layer 4 made of PZT is formed on the first electroconductive layer 3 located on the main surface side of the substrate 31.

At this time, as the relative positional relationship among the substrate (W), the first adhesion-preventing plate 104, and the third adhesion-preventing plate 111, the configuration shown in FIG. 4B is adopted.

Particularly, in the case of forming the dielectric layer 4, the substrate temperature in the film formation time is controlled based on a predetermined temperature profile as necessary.

A constant temperature may be maintained from the start of film formation to completion of the film formation, and for example, the temperature at the start of film formation may be determined to be higher than that of the completion of the film formation.

(Step C): Formation of Second Electroconductive Layer

As shown in FIG. 2C, the second electroconductive layer 5 is formed so as to coat the first electroconductive layer 3 and the dielectric layer 4.

In the step C, a Pt film serving as the second electroconductive layer 5 is formed by a sputtering method.

A Pt target serving as the target 21 is disposed in the vacuum chamber 11c (11), the pressure of the internal space of the vacuum chamber is reduced by the vacuum pump 15, and the internal space of the vacuum chamber is thereby in a vacuum state of having a high degree of vacuum that is higher than the degree of vacuum atmosphere in which a film is formed.

While maintaining the vacuum atmosphere in the vacuum chamber 11c (11), the substrate 31 on which the first electroconductive layer 3 and the dielectric layer 4 are provided in advance as shown in FIG. 2B is transferred from the vacuum chamber 11b (11) to the internal space of the vacuum chamber 11c (11).

Subsequently, the substrate 31 is held on the center region of the surface of the first support (S1) so that the main surface of the substrate 31, that is, the dielectric layer 4 faces the sputtering surface of the Pt target 21.

After that, while maintaining the substrate 31 at a film deposition temperature by use of the temperature controllers (H1, H2), 105, and 106, Ar gas serving as a sputtering gas is introduced into the inside of the vacuum chamber 11c (11) from the sputtering gas introduction unit 14, and the Pt target is sputtered by applying an alternating voltage to the cathode electrode 22 from the sputtering power source 13.

Accordingly, the second electroconductive layer 5 formed of the Pt film is formed on the dielectric layer 4 located on the main surface side of the substrate 31.

At this time, as the relative positional relationship between the substrate (W) and the first adhesion-preventing plate 104, the configuration shown in FIG. 3B is adopted.

Consequently, as shown in FIG. 2C, the second electroconductive layer 5 is formed so as to coat the dielectric layer 4 and the outer-peripheral end region at which the first electroconductive layer 3 is exposed.

The supply of the electrical current from the heating power source 17 to the heat generation member (not shown in the figure) which is provided inside the temperature controllers (H1, H2), 105, and 106 is stopped, the heat generation member (not shown in the figure) is cooled down, and the temperature of the substrate 31 becomes lower than the film deposition temperature.

For example, in the vacuum chamber 11c (11), the temperature of the heat generation member (not shown in the figure) is reduced to be lower than or equal to 400° C., and the temperature is maintained.

While maintaining the vacuum atmosphere in the vacuum chamber 11, the post-coated substrate (W), on which a multi-layered film obtained by sequentially stacking the three layers (the first electroconductive layer, the dielectric layer, and the second electroconductive layer) is formed, is transferred to the outside of the vacuum chamber 11 and transferred through an outlet which is not shown in the figure to the outside.

Particularly, in the above-described transfer of the substrate, that is, the transfer of the substrate from the outside to the vacuum chamber 11a (11), the transfer of the substrate between the vacuum chambers, the transfer of the substrate from the vacuum chamber 11c (11) to the outside, a transfer robot which is not shown in the figure is preferably used.

The multi-layered film 1 having the structure shown in FIG. 2C is manufactured by the above-described manner.

In this multi-layered film 1, the first electroconductive layer 3 and the second electroconductive layer 5 which are located under and above the dielectric layer 4 are in a state of being electrically connected to each other, and therefore in the subsequent process, a step of electrically interrupting them is carried out.

(Step D): Removal of Portion at Which First Electroconductive Layer 3 Comes into Contact with Second Electroconductive Layer 5

Subsequently, in the step D, at a desired position C that is located inside the outer-peripheral end region of the first electroconductive layer 3, the portion located outside the position C is removed from the layered body constituted of the first electroconductive layer 3, the dielectric layer 4, and the second electroconductive layer 5.

FIG. 2D shows an example of removing both the layered body and the substrate 2 are removed together; however, the layered body may be only removed while leaving the substrate 2.

Regarding whether or not removal of the substrate 2 is carried out, a preferred configuration is appropriately selected in a post-process.

Particularly, as "a method of removing the portion at which the first electroconductive layer 3 directly overlaps the second electroconductive layer 5", not only a method of removing only the structural body constituted of the first electroconductive layer 3, the dielectric layer 4, and the second electroconductive layer 5 by etching or photolithography but also a method of removing both the structural body and the substrate 2 by dicing, or the like are preferably used.

As mentioned above, as a result of removing the portion at which the first electroconductive layer 3 directly overlaps the second electroconductive layer 5 from the multi-layered film 1 shown in FIG. 2D, a structural body is obtained which has the first electroconductive layer 3, the dielectric layer 4, and the second electroconductive layer 5, which are sequentially stacked on the main surface of the substrate 2.

That is, for example, on the substrate 2 having a large area, even where the two-dimensional position is located at the center or near the outer-peripheral end on the substrate on which the multi-layered film is to be formed, it is possible to stably manufacture the multi-layered film 1 including the dielectric layer 4 having a desired film composition without depending on the position the substrate.

Consequently, chips having excellent characteristics such as high piezoelectricity and high voltage resistance are stably obtained.

The foregoing multi-layered film 1 is preferably used in, for example, a piezo element or the like.

Figure 2E:
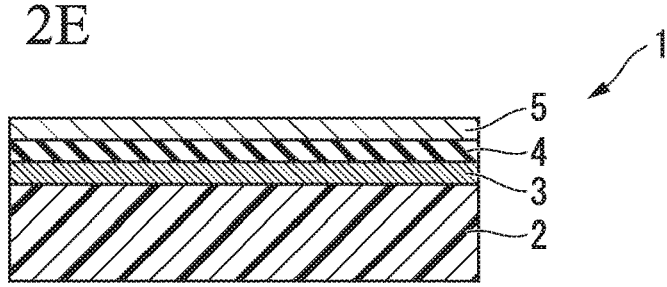
FIG. 2E is a cross-sectional view showing a process of manufacturing the multi-layered film according to the embodiment.

The multi-layered film 1 that is obtained by the above-described steps A to D has the configuration shown in FIG. 2E.

That is, the multi-layered film having the configuration shown in FIG. 1 is formed.

In the multi-layered film 1 that is formed by being subjected to the above-described steps A to D, during film formation or after film formation, adhesion of sputtered particles is prevented, even in the case where adhesion of sputtered particles occurs, the portion at which the adhesion of sputtered particles occurs is reliably removed.

Consequently, according to the invention, it is possible to provide a method of manufacturing the multi-layered film in which the adhesion of sputtered particles is prevented.

EXPERIMENTAL EXAMPLE

Hereinbelow, examples of experiment will be described which are carried out in order to check the effect of the above-described invention.

In the step A, distances (first edge cutting amount: E1), each of which is between the side end of a substrate 2 and the side end of a first electroconductive layer 3 located inside the side end of the substrate 2, were varied; first electroconductive layers 3 were formed on substrates 2; thereafter dielectric layers 4 formed of a PZT film were formed above the first electroconductive layers 3; and the characteristics of the dielectric layer 4 were evaluated.

At this time, the distance (second edge cutting amount: E2) which is between the side end of the substrate 2 and the side end of the dielectric layer 4 located inside the side end of the substrate 2 was not changed and was determined to be a predetermined value.

Experimental Example 1

Figure 6:
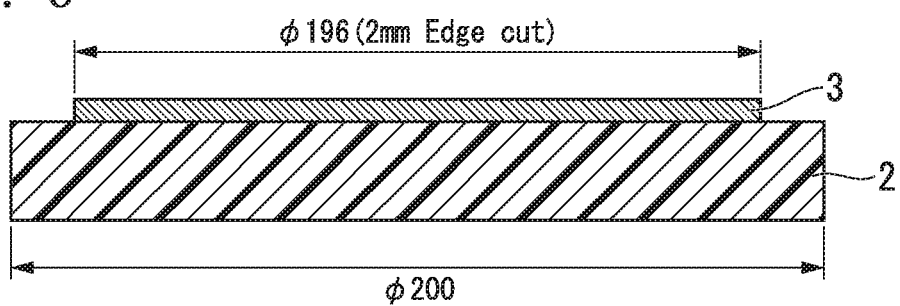
FIG. 6 is a cross-sectional view showing a state where a first electroconductive layer is formed on a substrate.

In this example, a Si wafer having a diameter of 200 mm (8 inch) was used as the substrate 2, the first edge cutting amount (E1) was 2 mm, and the first electroconductive layer 3 formed of a Pt film was formed (FIG. 6).

Thereafter, the second edge cutting amount (E2) was fixed as 10 mm, the dielectric layer 4 was formed, and a layered film having the configuration shown in FIG. 2B was thereby formed.

That is, in this example, the film formation apparatuses shown in FIGS. 3A to 4B were used, and $\varphi 1=196$ mm, $\varphi 2=180$ mm were set.

The sample which is manufactured by the experimental example 1 was referred to as Sample 1.

Experimental Example 2

In this example, a layered film having the configuration shown in FIG. 2B was thereby formed in a way similar to the case of the experimental example 1 with the exception that the first edge cutting amount (E1) was 5 mm That is, in this example, the film formation apparatuses shown in FIGS. 3A to 4B were used, and $\varphi 1=190$ mm, $\varphi 2=180$ mm were set.

The sample which is manufactured by the experimental example 2 was referred to as Sample 2.

Experimental Example 3

Figure 14A:
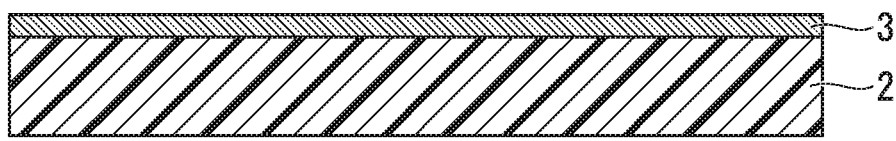
FIG. 14A is a cross-sectional view showing a conventional process of manufacturing the multi-layered film.
Figure 14B:
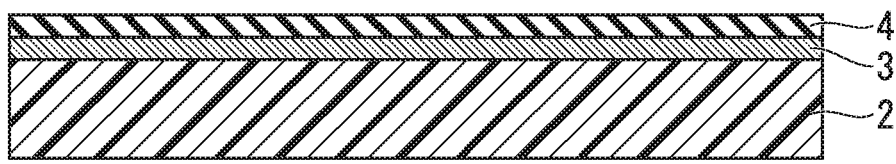
FIG. 14B is a cross-sectional view showing a conventional process of manufacturing the multi-layered film.
Figure 14C:
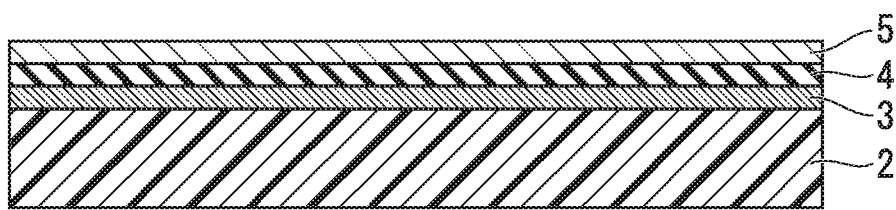
FIG. 14C is a cross-sectional view showing a conventional process of manufacturing the multi-layered film.

In this example, a layered film having the configuration shown in FIG. 2B was formed in a way similar to the case of the experimental example 1 with the exception that the first edge cutting amount (E1) is 0 mm This means that the layered film having the configuration shown in FIG. 14B is manufactured.

Figure 15A:
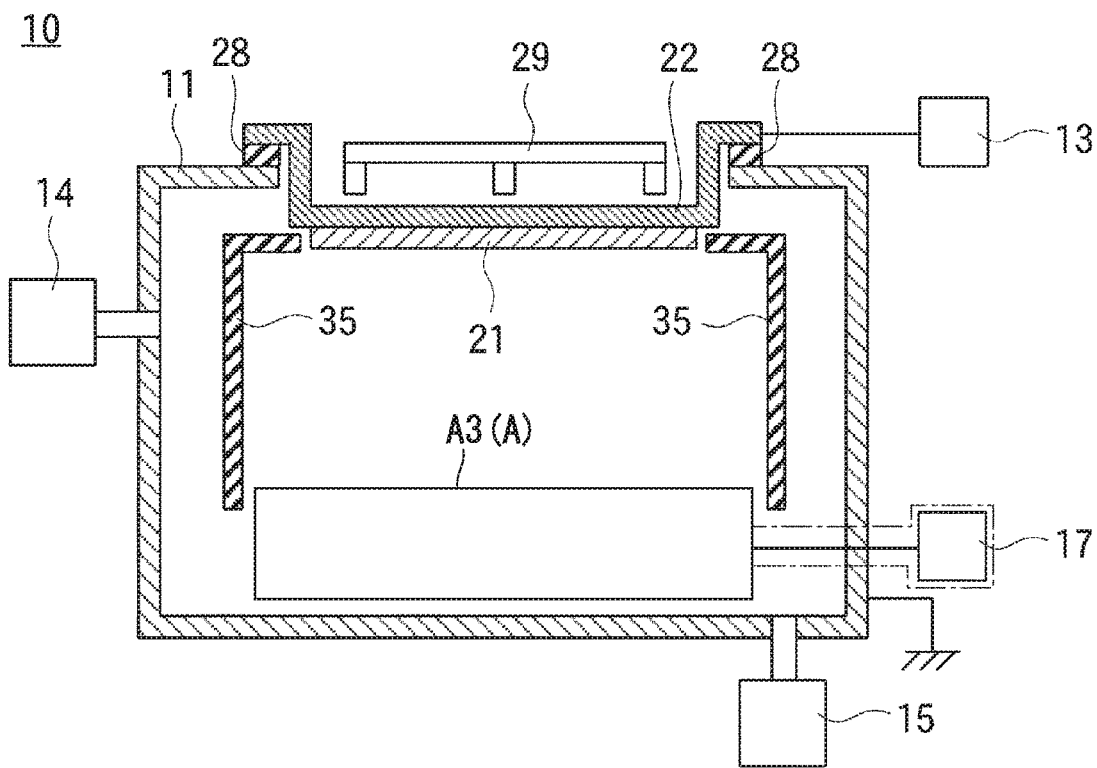
FIG. 15A is a view schematically showing an example of a conventional film formation apparatus.
Figure 15B:
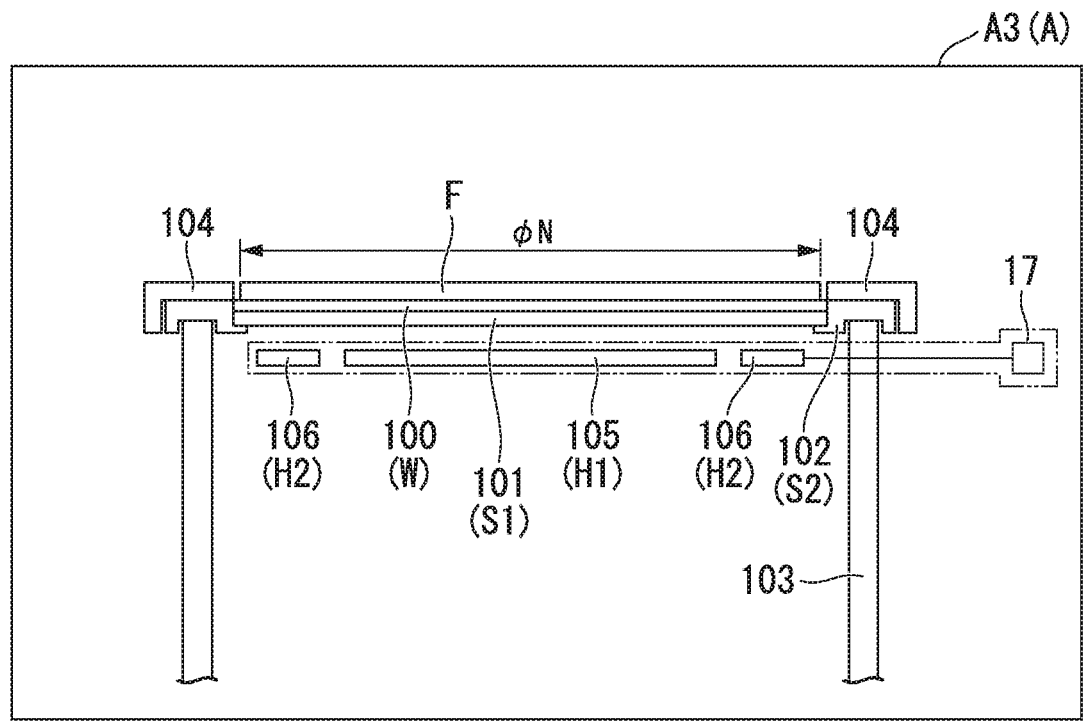
FIG. 15B is a view schematically showing an example of a conventional film formation apparatus.

In this example, a film formation apparatus shown in FIGS. 15A and 15B was used, and $\varphi N=200$ mm is set (that is, a coating is formed on the entire surface of a substrate 2 having a diameter of 200 mm).

The sample which is manufactured by the experimental example 3 was referred to as Sample 3.

Figure 7:
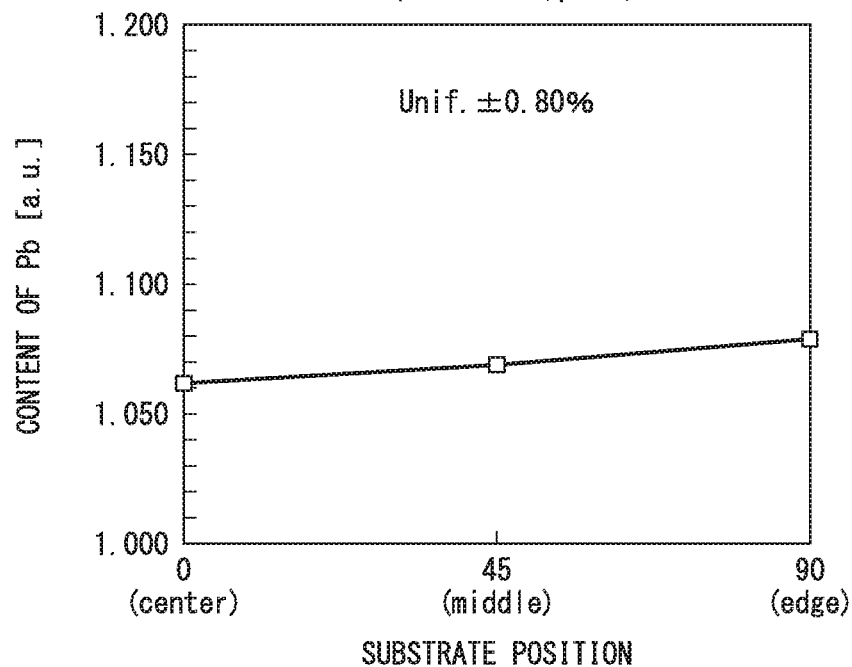
FIG. 7 is a chart showing the amounts of Pb of the PZT film formed by Sample 1 (2 mm).

FIG. 7 is a chart showing the relationship between the amounts of Pb of the dielectric film 4 formed in the experimental example 1 (E1=2 mm) and a substrate position.

Figure 8:
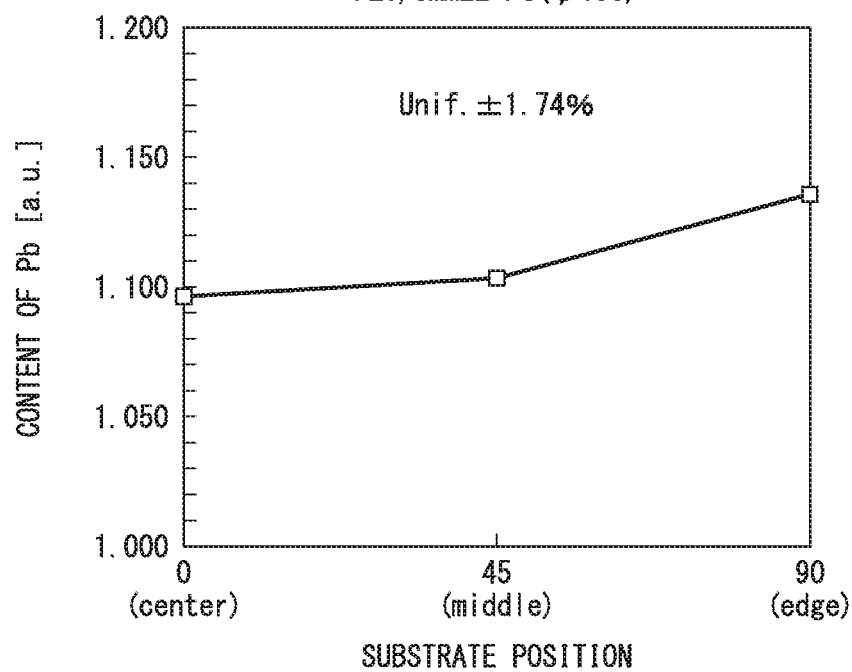
FIG. 8 is a chart showing the amounts of Pb of the PZT film formed by Sample 2 (5 mm).

FIG. 8 is a chart showing the relationship between the amounts of Pb of the dielectric film 4 formed in the experimental example 2 (E1=5 mm) and a substrate position.

In the x-axis of each chart, the "0" means the position (center) of the dielectric film 4 which corresponds to the center of the substrate.

The "45" means the half position (middle) of the dielectric film 4 in the radial direction of the substrate.

The "90" means the position (edge) located near the outer-peripheral end of the dielectric film 4 in the radial direction of the substrate.

The following points were apparent from the experimental examples 1 to 3.

(A1) The amounts of Pb of the dielectric film 4 (Sample 1) formed by the experimental example 1 (E1=2 mm) was extremely uniform (Unif. ±0.80%) in the radial direction of the substrate (FIG. 7).

(A2) The amounts of Pb of the dielectric film 4 (Sample 2) formed by the experimental example 2 (E1=5 mm) was twice or more of that of the experimental example 1 and was non-uniform (Unif. ±1.74%) in the radial direction of the substrate (FIG. 8).

Particularly, in the direction from "45" to "90", variation in composition tends to be obvious.

(A3) In the case of the experimental example 3 (E1=0 mm), normal film formation was carried out on the entire top surface of the substrate W; however, the phenomenon that sputtered particles pass through a slight space between the side surface of the substrate (W) and the first adhesion-preventing plate 104 and are adhered to the periphery thereof was generated, and a coating was formed on not only the side surface of the substrate but also the back surface close to the side surface.

Consequently, it was observed that a large variation in composition locally occurs in the dielectric film 4 located near the outer-peripheral end (edge) of the substrate at the dielectric film 4 (sample 3) formed by the experimental example 3.

From the results described above, in the case where the first adhesion-preventing plate 104 shown in FIG. 3B is arranged so as to coat the upper surface and the outer side surface of the second support (S2) and so as to coat the region (referred to as an edge cutting region 1) from the outer-peripheral end of the substrate (W) at a predetermined distance (E1), it is preferable that the first adhesion-preventing plate be arranged so as to satisfy the relational expression of $0 < E1 \text{ (mm)} \leq 2$.

As a result, it is possible to limit variation in composition of the dielectric film 4 in the radial direction of the substrate (W) to be less than or equal to 1%.

Figure 9:
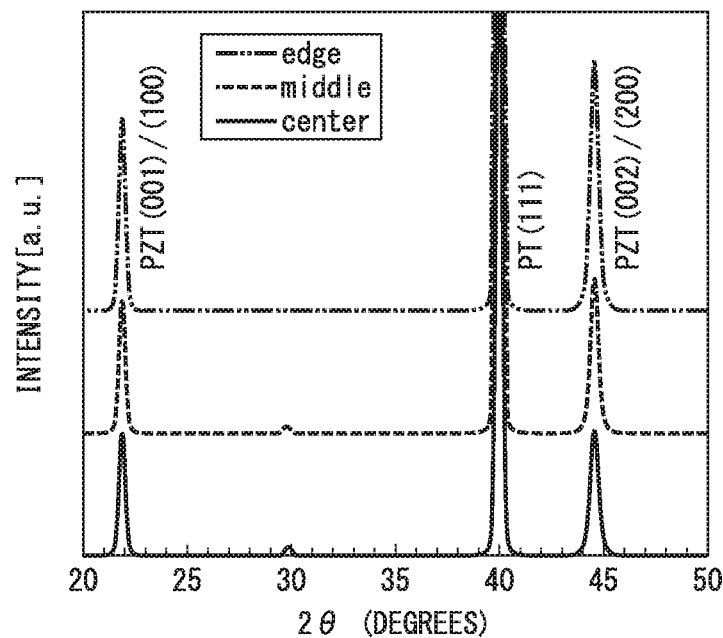
FIG. 9 is a chart showing an X-ray chart of the PZT film formed by Sample 1.

FIG. 9 is a chart showing an X-ray chart of the dielectric film 4 formed by the experimental example 1 (E1=2 mm).

Figure 10:
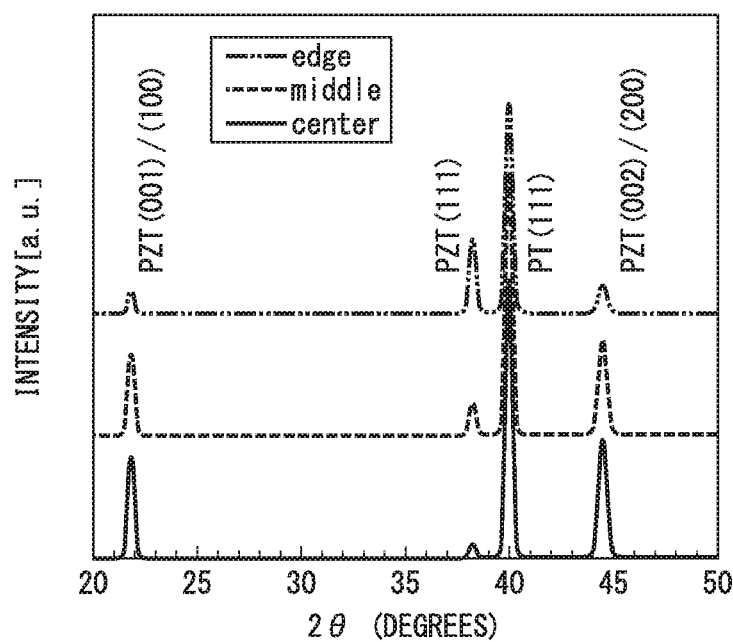
FIG. 10 is a chart showing an X-ray chart of the PZT film formed by Sample 2.

FIG. 10 is a chart showing an X-ray chart of the dielectric film 4 formed by the experimental example 2 (E1=5 mm).

In each chart, three lines are shown, the "solid line" means the position (center) of the dielectric film 4 which corresponds to the center of the substrate.

The "dotted line" means the half position (middle) of the dielectric film 4 in the radial direction of the substrate.

The "chain double-dashed line" means the position (edge) located near the outer-peripheral end of the dielectric film 4 in the radial direction of the substrate.

The following points were apparent from FIGS. 9 and 10.

(B1) In the case of the experimental example 1 (E1=2 mm), X-ray profiles which are substantially similar to each other as were obtained without depending on the evaluation positions (center, middle, and edge).

Consequently, it was found that the dielectric film 4 (Sample 1) manufactured by the experimental example 1 has substantially the same film configuration in the radial direction of the substrate.

(B2) In the case of the experimental example 2 (E1=5 mm), various X-ray profiles which depend on the evaluation positions (center, middle, and edge) were obtained.

In the direction from the center of the substrate to the outer-peripheral end of the substrate, the intensity (PZT (001)/(100), PZT (002)/(200)) of the diffraction peak tends to weaken.

In Sample 2, the diffraction peak due to PZT (111) was observed, and the intensity of the diffraction peak due to PZT (111) shows an opposite tendency, that is, the intensity tends to be higher in the direction from the center of the substrate to the outer-peripheral end of the substrate.

Accordingly, it was found that the dielectric film 4 (Sample 2) manufactured by the experimental example 2 has various film configurations in the radial direction of the substrate.

From the results described above, the dielectric film 4 (Sample 1) manufactured by the experimental example 1 realizes a uniform film composition and film structure without depending on the position the substrate.

Therefore, in the case of forming a multi-layered film on, for example, on a large-scaled substrate by use of the manufacturing method and the manufacturing apparatus according to the embodiment, it was determined that it is necessary for E1 to be less than or equal to 2 mm The inventors presume that the above-mentioned experimental results (FIGS. 7 to 10) may be based on a thermal effect during film formation.

Figure 11:
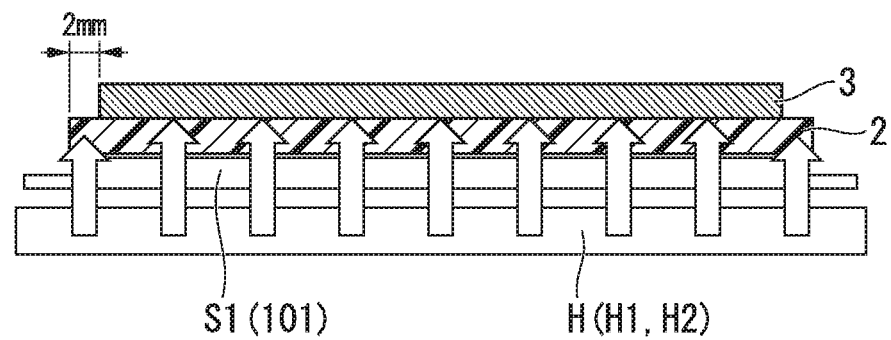
FIG. 11 is a view schematically showing a heating state where the PZT film of Sample 1 receives heat during film formation.

FIG. 11 is a view schematically showing a heating state where the PZT film receives heat during film formation in the experimental example 1 (E1=2 mm).

Figure 12:
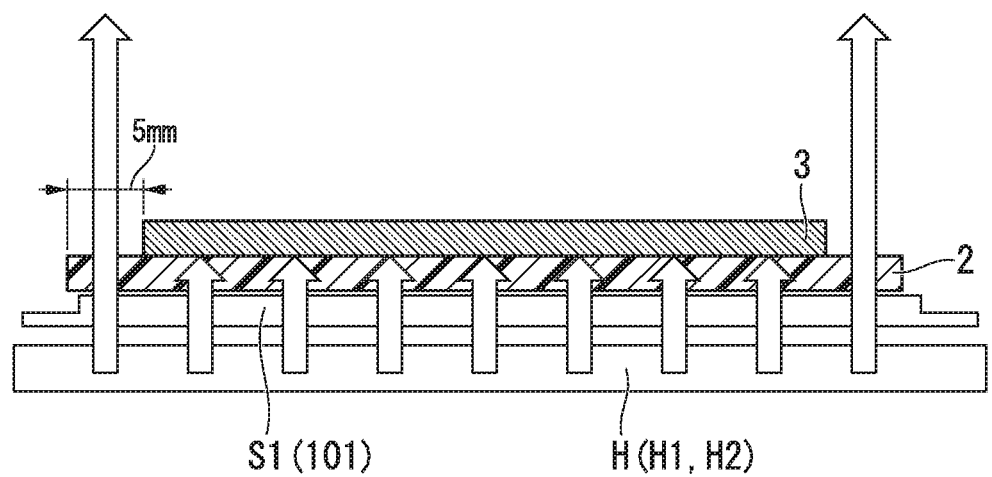
FIG. 12 is a view schematically showing a heating state where the PZT film of Sample 2 receives heat during film formation.
Figure 13:
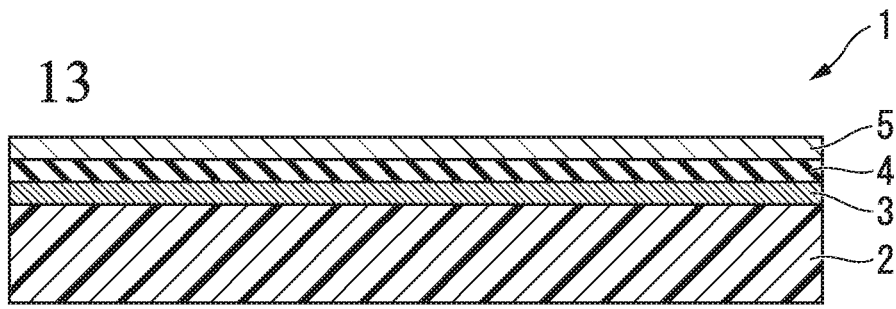
FIG. 13 is a cross-sectional view showing a configuration example of a conventional multi-layered film.

FIG. 12 is a view schematically showing a heating state where the PZT film receives heat during film formation in the experimental example 2 (E1=5 mm).

In FIGS. 11 and 12, the outlined thick arrows represent a state where heat is transmitted from the temperature controller toward the substrate and the first electroconductive layer.

The following points were apparent from FIGS. 11 and 12.

(C1) In the case of the experimental example 1 (E1=2 mm), in the radial direction of the substrate from the center of the substrate to near the outer-peripheral end thereof, the heat generated from the temperature controllers (H1, H2), 105, and 106 is transmitted through the substrate (W) 2 and the first electroconductive layer 3 to the deposition surface of the dielectric layer 4 formed thereon (that is, the surface of the first electroconductive layer 3).

(C2) As compared with the experimental example 1 (E1=2 mm), in the case of the experimental example 2 (E1=5 mm), the region where the first electroconductive layer 3 is absent widely exists on the substrate (W) 2 near the outer-peripheral end of the substrate.

In this region, the heat generated from the temperature controllers (H1, H2), 105, and 106 passes through the substrate (W) 2 and the first electroconductive layer 3 and transfers to the upper space.

The heat is transmitted to near the center of the substrate (center to middle) in a manner similar to the experimental example 1 (E1=2 mm).

From the thermal models shown in FIGS. 11 and 12, the inventors considered that, in the case of the experimental example 1 (E1=2 mm), the film composition and the film structure are uniform in the substrate radial direction, and that, in the case of the experimental example 2 (E1=5 mm), the non-uniform tendency may conspicuously occur in the direction toward the outer-peripheral end.

In the above-description, the case is particularly described where the multi-layered film according to the embodiment is configured to include a first electroconductive layer/a dielectric layer/a second electroconductive layer; however, as long as the dielectric layer includes a chemical element having a high vapor pressure, it is very likely that the phenomenon similar to the above occurs.

Accordingly, the manufacturing method and the manufacturing apparatus according to the embodiment are sufficiently applicable to the case of forming a layered structure in which the lower and upper surfaces of a specified layer including a chemical element having a high vapor pressure are sandwiched between the electroconductive layers.

While preferred embodiments of the invention have been described and illustrated above, the invention is not limited to the embodiments.

Various modifications may be made without departing from the scope of the invention.

INDUSTRIAL APPLICABILITY

The invention is widely applicable to a multi-layered film, a manufacturing method thereof, and a manufacturing apparatus thereof.

What is claimed is:

1. A method of manufacturing a multi-layered film, the multi-layered film comprising a first electroconductive layer, a dielectric layer, and a second electroconductive layer, which are sequentially layered and disposed on a main surface of a substrate, the method comprising:
   forming the first electroconductive layer on the substrate so that a side end of the first electroconductive layer is located inside a side end of the substrate and is located further inward than the side end of the substrate on the main surface of the substrate;
   forming the dielectric layer so as to coat the first electroconductive layer and expose an outer-peripheral end region on a top surface of the first electroconductive layer so that the side end of the first electroconductive layer and a side end of the dielectric layer are sequentially displaced in a direction from the side end of the substrate to a center of the substrate and so that a lower surface of the dielectric layer comes into contact with an upper surface of the first electroconductive layer;

forming the second electroconductive layer so as to coat both the dielectric layer and the outer-peripheral end region at which the first electroconductive layer is exposed so that an upper surface and a side surface of the dielectric layer are coated with the second electroconductive layer, the dielectric layer is in a state where both the top and back surfaces and the side surface of the dielectric layer are all sealed, and a side end of a portion at which the first electroconductive layer directly overlaps the second electroconductive layer is located inside the side end of the substrate on the main surface of the substrate; and at a desired position that is located inside the outer-peripheral end region of the first electroconductive layer, removing a portion located outside the position from a layered body that is constituted of the first electroconductive layer, the dielectric layer, and the second electroconductive layer so that the first electroconductive layer, the dielectric layer, and the second electroconductive layer, which constitute the layered body, have the same length.

* * * * *